US006851978B2

(12) United States Patent
Akama et al.

(10) Patent No.: US 6,851,978 B2
(45) Date of Patent: Feb. 8, 2005

(54) CONNECTOR DEVICE INCLUDING GASKET MOUNTED BY LOCKING PART OF GASKET HOOKING LOCKED PART OF METAL ARTICLE

(75) Inventors: Junichi Akama, Shinagawa (JP); Mitsuru Kobayashi, Shinagawa (JP); Tadashi Kumamoto, Shinagawa (JP); Takahiro Kondou, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 10/373,748

(22) Filed: Feb. 27, 2003

(65) Prior Publication Data

US 2004/0058584 A1 Mar. 25, 2004

(30) Foreign Application Priority Data

Sep. 19, 2002 (JP) ...................................... 2002-273153

(51) Int. Cl.[7] ........................................... H01R 13/648
(52) U.S. Cl. ....................................... 439/607; 439/687
(58) Field of Search ......................... 439/687, 607–610, 439/587, 589

(56) References Cited

U.S. PATENT DOCUMENTS

| | | | | | |
|---|---|---|---|---|---|
| 4,599,680 | A | * | 7/1986 | Gibson et al. | ............... 361/684 |
| 5,004,866 | A | * | 4/1991 | Cooke et al. | ........... 174/35 GC |
| 6,395,976 | B1 | * | 5/2002 | Koradia et al. | ........ 174/35 GC |
| 6,752,663 | B2 | * | 6/2004 | Bright et al. | ................ 439/607 |

* cited by examiner

*Primary Examiner*—J. F. Duverne

(57) ABSTRACT

A gasket is mounted on a connector device for providing an electromagnetic shielding. The gasket has a form of a rectangular frame, and includes a locking part on each of shorter-side portions opposing each other as shorter sides of the rectangular frame. The connector device includes a locked part in a metal article pressed into a through hole formed in an insulator. The gasket is mounted on the connector device by the locking part of the gasket hooking the locked part of the metal article.

13 Claims, 11 Drawing Sheets

CONNECTOR DEVICE INCLUDING GASKET MOUNTED BY LOCKING PART OF GASKET HOOKING LOCKED PART OF METAL ARTICLE

BACKGROUND OF THE INVENTION

1. Field of the Invention

The present invention generally relates to a connector device, and more particularly, to a connector device including a gasket for preventing a leakage of electromagnetic noises.

Recently, electronic apparatuses, such as a computer, a server, a switching device, and a router, have become capable of processing information at high rates; accordingly, transmission rates of networking signals have become higher. As transmission rates of signals become higher, electromagnetic noises become more likely to leak from an area of a connector device. Therefore, it is an important factor to provide electromagnetic shielding for the area of the connector device. Thereupon, in general, a gasket is provided for providing electromagnetic shielding to an opening part of an I/O panel of a computer, etc.

2. Description of the Related Art

FIG. 1A is a magnified view of a part of a conventional connector device 1 with a gasket disassembled. FIG. 1B is a cross-sectional view taken along a vertical plane IB in FIG. 1A. X1-X2 indicates a longitudinal direction of the connector device 1; Y1-Y2 indicates a depth direction of the connector device 1; and Z1-Z2 indicates a height direction of the connector device 1.

As shown in FIG. 1A and FIG. 1B, the conventional connector device 1 comprises an insulator 2, a shielding member 3, a metal article 4, and a gasket 5. The shielding member 3 covers a part of the insulator 2. The metal article 4 is intensely pressed from direction Y1 into a through hole formed in the insulator 2, and is fixed therein.

The gasket 5 is in the form of a rectangular frame. The gasket 5 includes a multitude of spring pieces 5a formed along upper and lower sides, and also includes spring-piece portion 5b and protruding portion 5c inside the frame. The spring-piece portion 5b bends in direction Y1-Y2. The gasket 5 is mounted by being moved from direction Y2 to direction Y1 while being guided by the metal article 4. When the gasket 5 is moved in direction Y1 while being guided by the metal article 4, the spring-piece portion 5b is bent in direction Y2. The spring-piece portion 5b bent in direction Y2 and the protruding portion 5c resiliently hold the metal article 4 therebetween in direction Z1-Z2.

The gasket 5 is kept mounted on the connector device 1 only by friction between the spring-piece portion 5b and an upper surface of the metal article 4 and friction between the protruding portion 5c and an under surface of the metal article 4. Therefore, the gasket 5 is mounted without sufficient intensity; thus, there is a risk that the gasket 5 may come off due to impact, heat and so forth inflicted in the course of conveying the connector device 1.

SUMMARY OF THE INVENTION

It is a general object of the present invention to provide an improved and useful connector device in which the above-mentioned problems are eliminated.

A more specific object of the present invention is to provide a connector device including a gasket prevented from coming off.

In order to achieve the above-mentioned objects, there is provided according to one aspect of the present invention a connector device including a gasket mounted for providing an electromagnetic shielding, the gasket including a locking part, and a locked part, the gasket being mounted by the locking part hooking the locked part.

According to the present invention, the locking part of the gasket hooks the locked part of the connector device. Therefore, the gasket is mounted with high intensity, compared with a conventional gasket mounted by friction.

In order to achieve the above-mentioned objects, there is also provided according to another aspect of the present invention a connector device including a gasket mounted for providing an electromagnetic shielding, the gasket having a form of a rectangular frame and including a locking part on each of shorter-side portions opposing each other as shorter sides of the rectangular frame, and a locked part included in a metal article pressed into a through hole formed in an insulator, wherein the gasket is mounted by the locking part hooking the locked part.

According to the present invention, the locked part is provided in the metal article pressed into the through hole formed in the insulator. Therefore, the locked part can be positioned freely.

Additionally, in the connector device according to the present invention, the locked part may be positioned outside the through hole, the locking part may be formed so as to project from the shorter-side portion within a plane containing the gasket, and the locking part may hook the locked part outside the through hole.

According to the present invention, the locking part of the gasket hooks the locked part of the metal article outside the through hole. Therefore, the locking part can be hooked in the locked part with ease.

Additionally, in the connector device according to the present invention, the locked part may be positioned within the through hole, the locking part may be formed on an arm portion bent from the shorter-side portion, and the locking part may hook the locked part within the through hole.

According to the present invention, the locking part of the gasket hooks the locked part of the metal article within the through hole. Therefore, the locking part is kept out of reach so that the locking part is not detached from the locked part erroneously. Thus, the gasket is mounted with high reliability.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

Figure 1A:
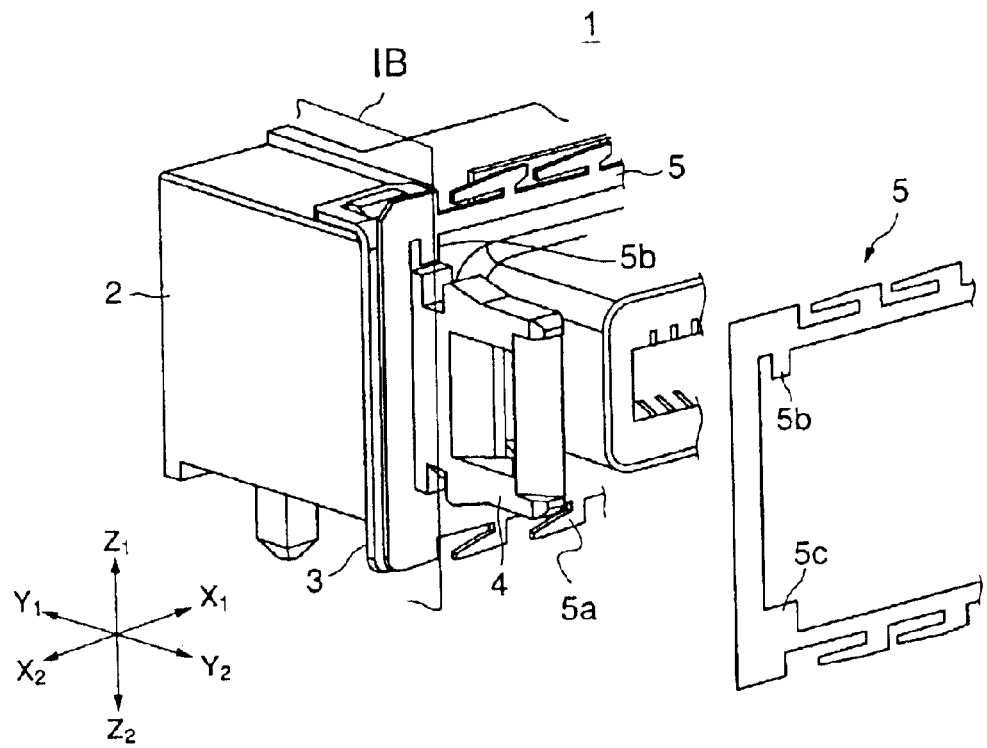
FIG. 1A is a magnified view of a part of a conventional connector device.
Figure 1B:
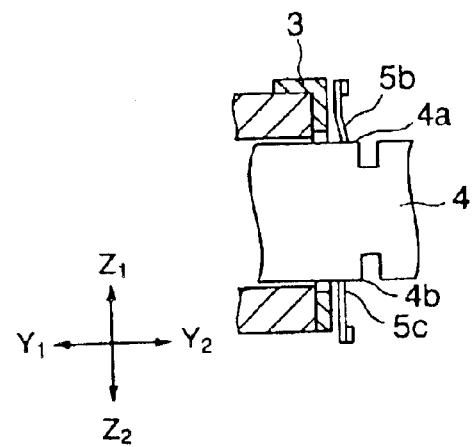
FIG. 1B is a cross-sectional view taken along a vertical plane IB in FIG. 1A.
Figure 2A:
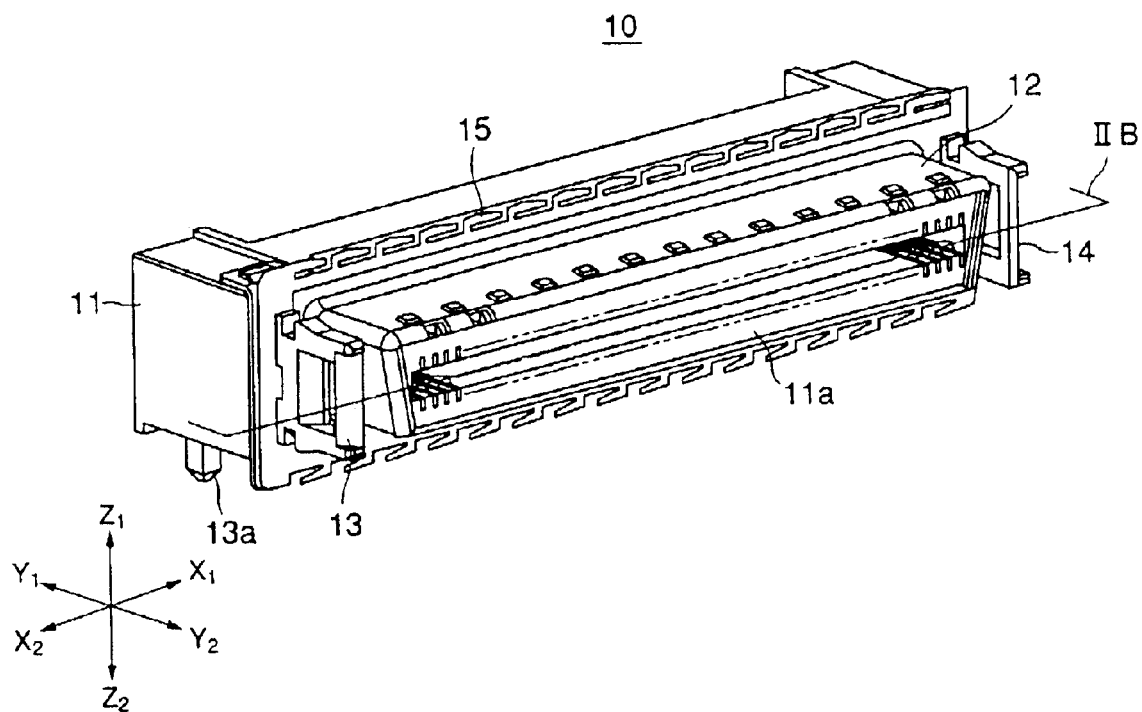
FIG. 2A is a perspective view of a connector device according to a first embodiment of the present invention.
Figure 2B:
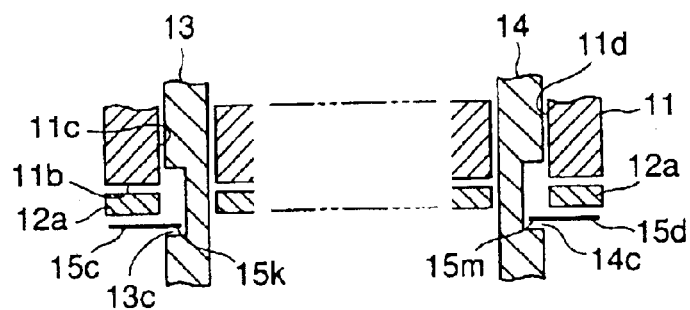
FIG. 2B is a cross-sectional view taken along a horizontal plane IIB in FIG. 2A.
Figure 3:
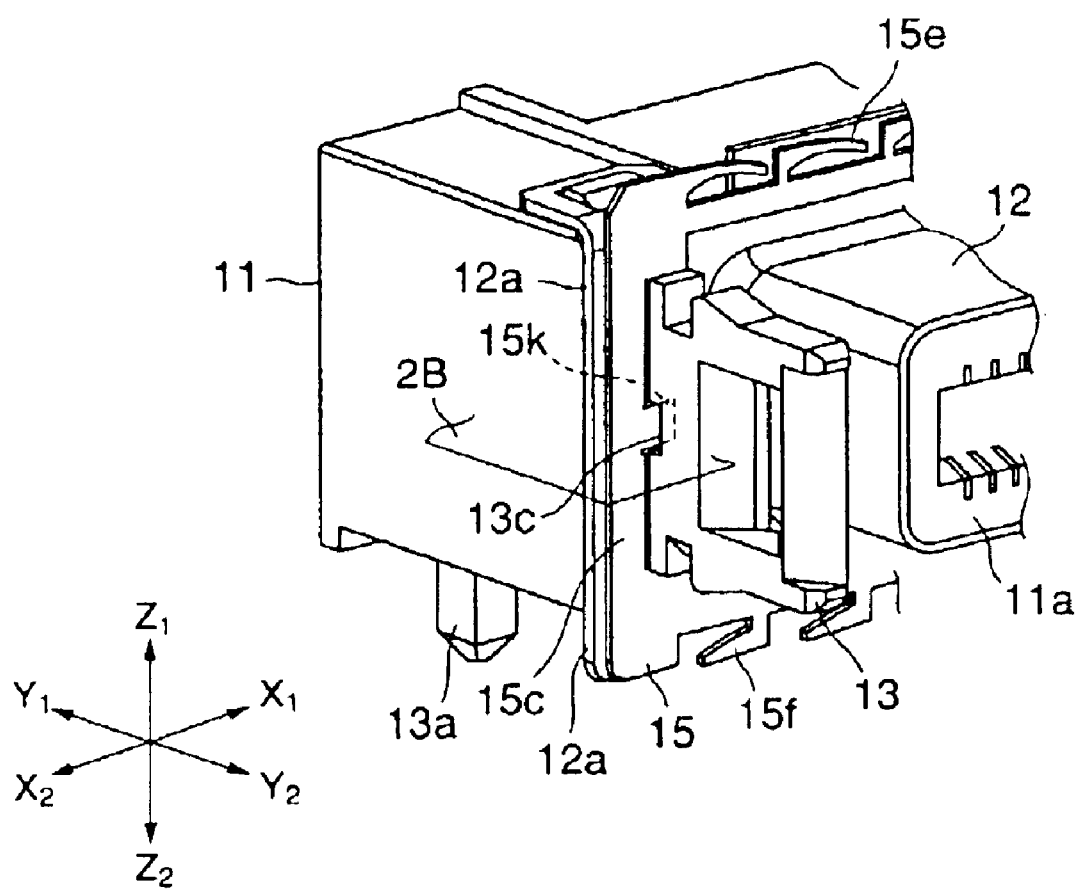
FIG. 3 is a magnified view of a part of the connector device shown in FIG. 2A.

FIG. 2A is a perspective view of a balanced transmission connector device 10 according to a first embodiment of the present invention. FIG. 2B is a cross-sectional view taken along a horizontal plane IIB in FIG. 2A. FIG. 3 is a magnified view of a part of the connector device 10. X1-X2 indicates a longitudinal direction of the connector device 10; Y1-Y2 indicates a depth direction of the connector device 10; and Z1-Z2 indicates a height direction of the connector device 10.

As shown in FIG. 2A to FIG. 3, the connector device 10 comprises an insulator 11, a shielding member 12, metal articles 13 and 14, and a gasket 15. The insulator 11 includes a projecting portion 11a projecting in direction Y2, which alternately contains each of balanced transmission signal contact members 16 and 17 and ground contact members, each of the contact members being directed in direction Y1-Y2 (also see FIG. 7). Additionally, the insulator 11 includes an end surface portion 11b around the periphery of the projecting portion 11a. The shielding member 12 is made of metal, and covers the projecting portion 11a and the end surface portion 11b of the insulator 11. A flange portion 12a of the shielding member 12 covers the end surface portion 11b. The metal articles 13 and 14 are intensely pressed from direction Y1 into through holes 11c and 11d, respectively, formed in the insulator 11, and are fixed therein. The metal articles 13 and 14 are positioned at both sides of the projecting portion 11a, each of the metal articles being directed in direction Y1-Y2, and are electrically connected with the shielding member 12.

Figure 4:
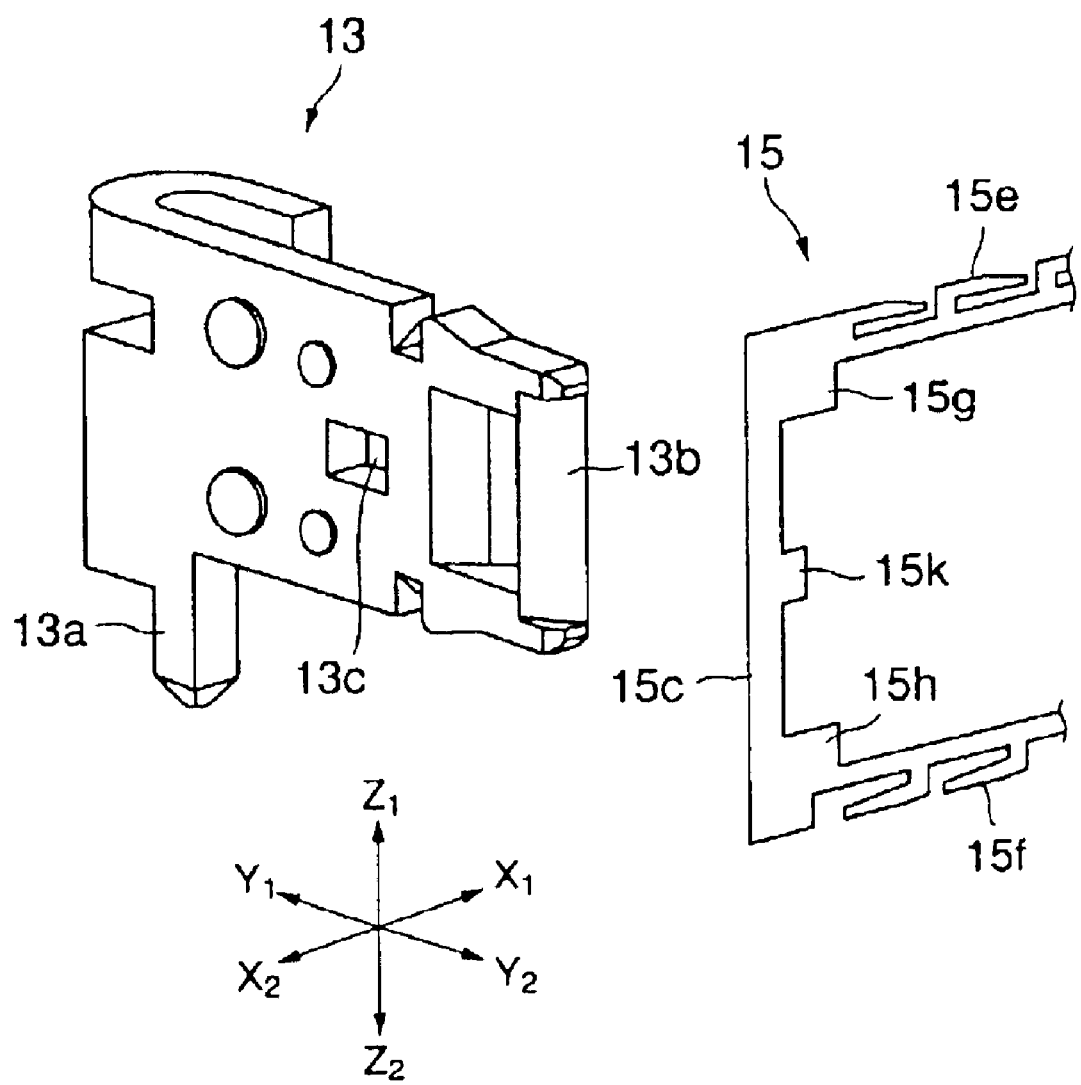
FIG. 4 is an exploded perspective view of a gasket and one metal article shown in FIG. 2A.
Figure 5:
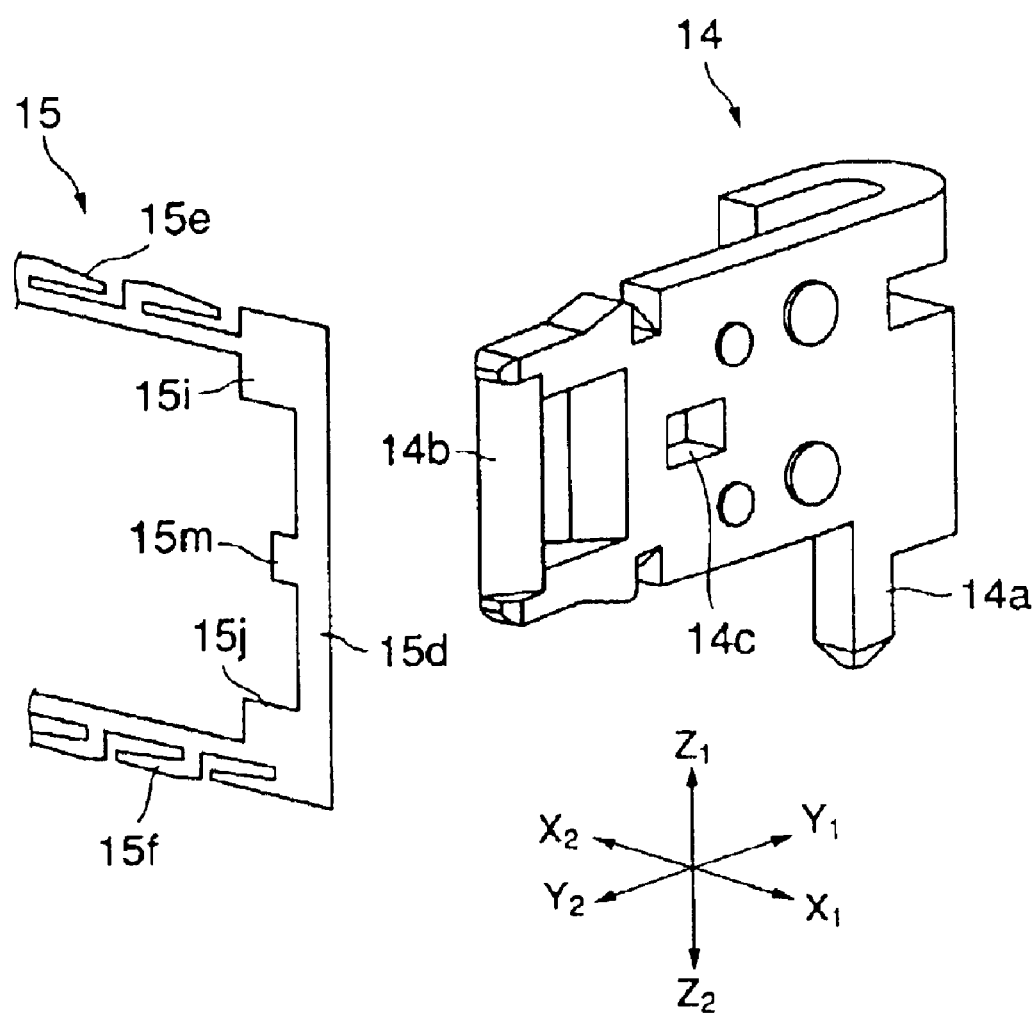
FIG. 5 is an exploded perspective view of the gasket and the other metal article shown in FIG. 2A.

As shown in FIG. 4, the metal article 13 includes a positioning post 13a at side Y1, a latch portion 13b at side Y2, and a receding portion 13c as a locked part at a central part of a surface at side X2. The positioning post 13a projects in direction Z2. In a state where the metal article 13 is fixed in the insulator 11, a part of the receding portion 13c is exposed from the insulator 11 in direction Y2. The latch portion 13b projects from the insulator 11 in direction Y2. The positioning post 13a projects from the insulator 11 in direction Z2. As shown in FIG. 5, the metal article 14 has a symmetrical form with the metal article 13 about Y-Z plane, and includes a positioning post 14a, a latch portion 14b, and a receding portion 14c as a locked part at a central part of a surface at side X1. The receding portions 13c and 14c may be replaced with through holes.

Figure 6:
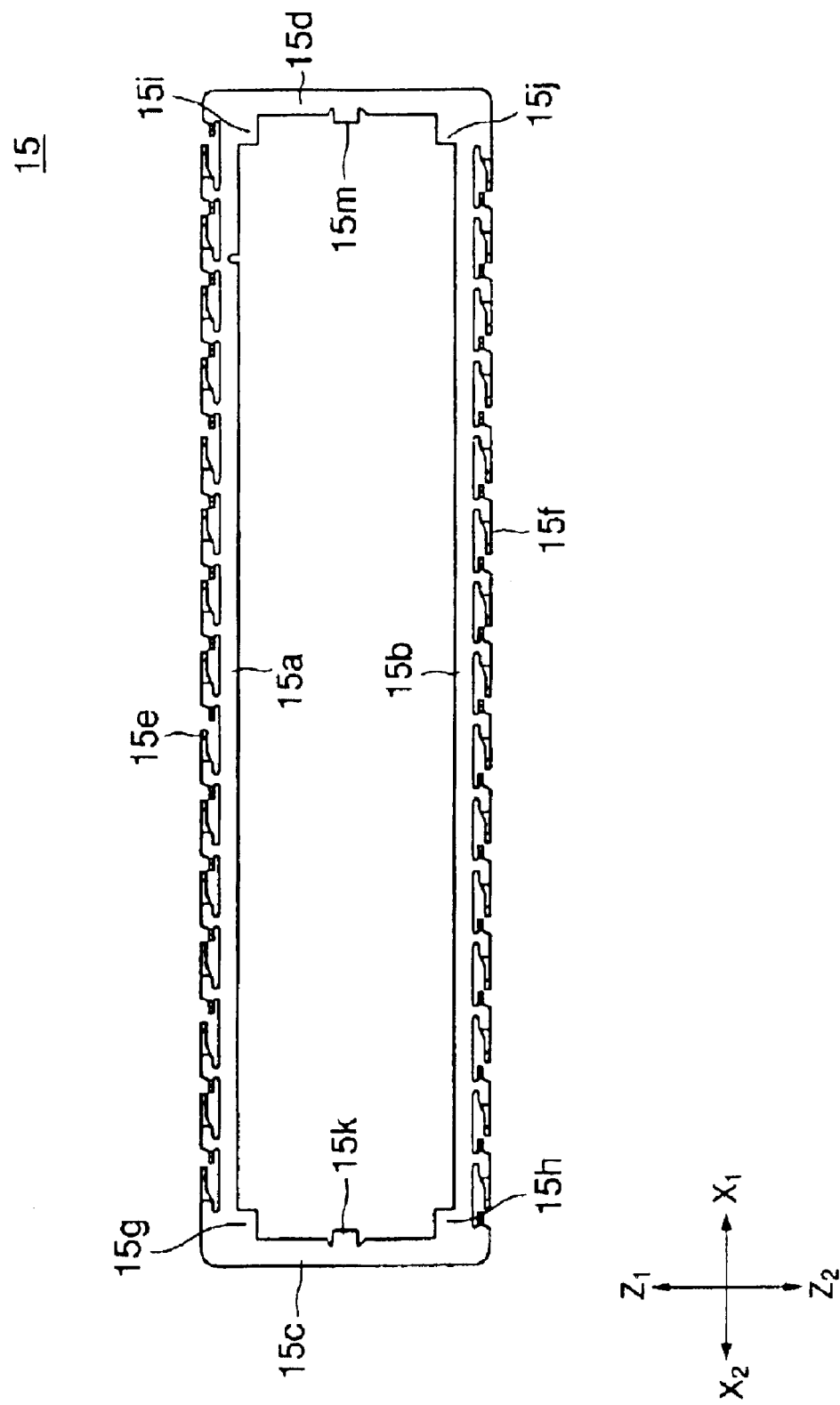
FIG. 6 is a front view of the gasket shown in FIG. 2A.

As shown in FIG. 6, the gasket 15 is made from a thin metal plate into the form of a rectangular frame; the gasket 15 includes an upper-side portion 15a and a lower-side portion 15b opposing each other as longer sides of the rectangular frame, and an X2-side portion 15c and an X1-side portion 15d (shorter-side portions) opposing each other as shorter sides of the rectangular frame. Additionally, the gasket 15 includes contact pieces 15e aligned along the upper-side portion 15a and contact pieces 15f aligned along the lower-side portion 15b, and also includes protruding portions 15g to 15j at each of corners inside the frame. The X2-side portion 15c includes a locking piece (a locking part) 15k at the center thereof, the locking piece 15k projecting toward inside of the gasket 15. Similarly, the X1-side portion 15d includes a locking piece (a locking part) 15m at the center thereof, the locking piece 15m projecting toward inside of the gasket 15.

As shown in FIG. 2A to FIG. 3, the gasket 15 is positioned with respect to the metal article 13 by the protruding portions 15g and 15h at the X2-side portion 15c, and the locking piece 15k engages the receding portion 13c by being hooked therein; also the gasket 15 is positioned with respect to the metal article 14 by the protruding portions 15i and 15j at the X1-side portion 15d, and the locking piece 15m engages the receding portion 14c by being hooked therein; thereby the gasket 15 is mounted on the connector device 10. Thus, the gasket 15 is mounted by the locking pieces 15k and 15m hooking and engaging the receding portions 13c and 14c, respectively; therefore, the gasket 15 does not come off even when the gasket 15 is subjected to strong impact or heat inflicted in the course of conveying the connector device 10.

Besides, the gasket 15 is mounted by being set and positioned around the latch portions 13b and 14b from direction Y2 of the connector device 10, and then being pressed against the connector device 10. Besides, as shown in FIG. 6, the locking pieces 15k and 15m are located at the center of the respective side portions 15c and 15d; additionally, the contact pieces 15e extend in direction X1, and the contact pieces 15f extend in direction X2. Thus, the gasket 15 has no orientation; i.e., the gasket 15 can be correctly mounted on the connector device 10 even when the gasket 15 is reversed in direction X1-X2 from the state shown in FIG. 3.

Figure 7:
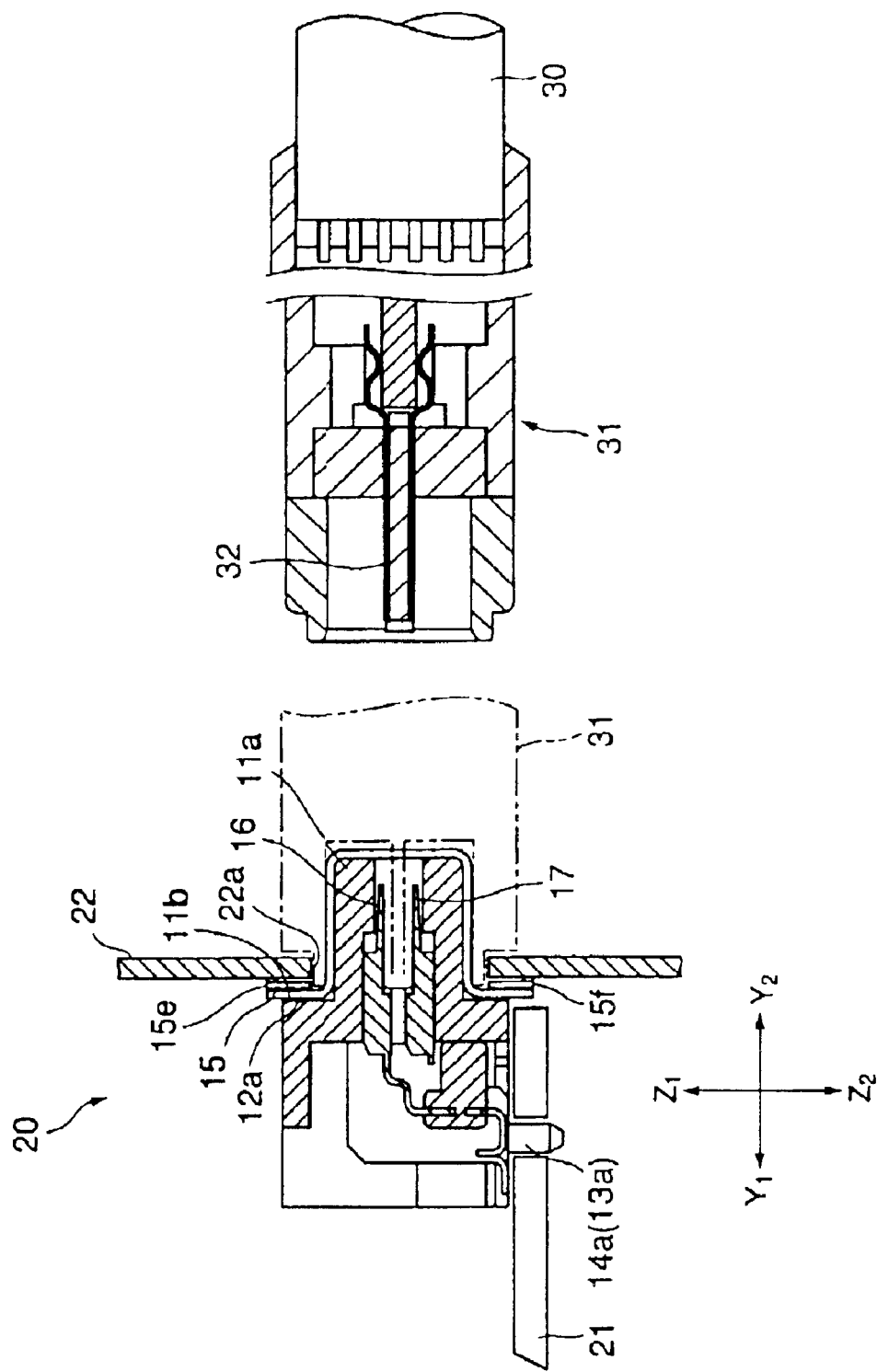
FIG. 7 is a side view of an example using the connector device shown in FIG. 2A.

The above-described connector device 10 is used by being mounted on a computer 20, for example, as shown in FIG. 7. The connector device 10 is positioned by the positioning posts 13a and 14a with terminals being soldered on pads so as to be mounted on a printed board 21. A back panel (an I/O panel) 22 includes an opening part 22a having a form corresponding to the projecting portion 11a. In a state where the back panel 22 is mounted, the projecting portion 11a of the connector device 10 projects from the opening part 22a in direction Y2, and a part of the back panel 22 around the periphery of the opening part 22a is pressed toward the flange portion 12a. The gasket 15 is held between the flange portion 12a and the back panel 22, and the contact pieces 15e and 15f are pressed against the back panel 22, the contact pieces 15e and 15f being bent flexibly. Thereby, in the computer 20, a leakage of electromagnetic noises from the opening part 22a is prevented. A connector 31 at an end of a cable 30 is connected to the connector device 10. A contact member 32 of the connector 31 is connected to the contact members 16 and 17, and hooks of the connector 31 are locked with the latch portions 13b and 14b.

Figure 8A:
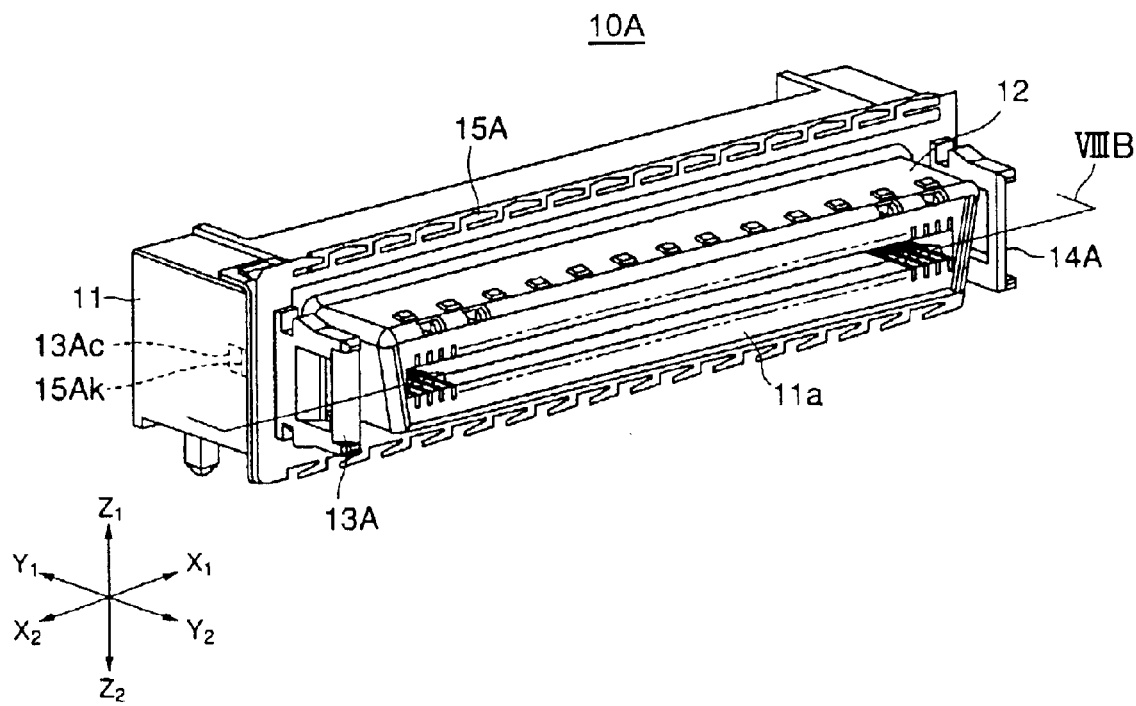
FIG. 8A is a perspective view of a connector device according to a second embodiment of the present invention.
Figure 8B:
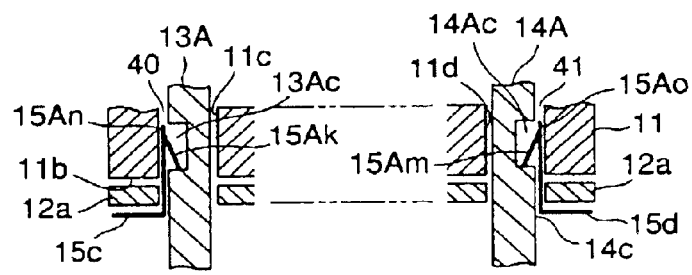
FIG. 8B is a cross-sectional view taken along a horizontal plane VIIIB in FIG. 8A.
Figure 9A:
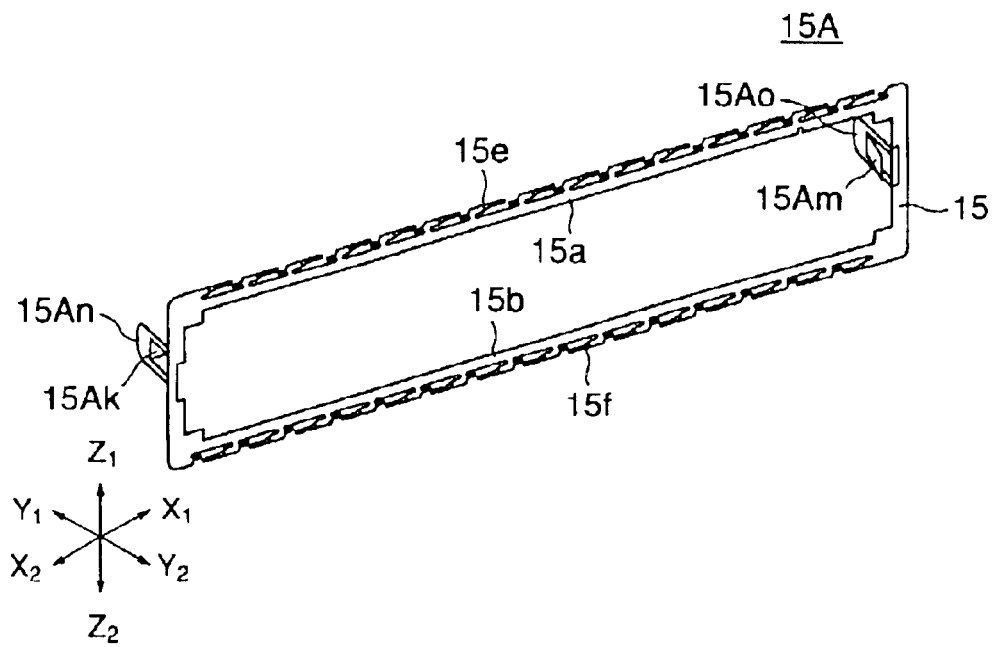
FIG. 9A is a perspective view of a gasket shown in FIG. 8A.
Figure 9B:
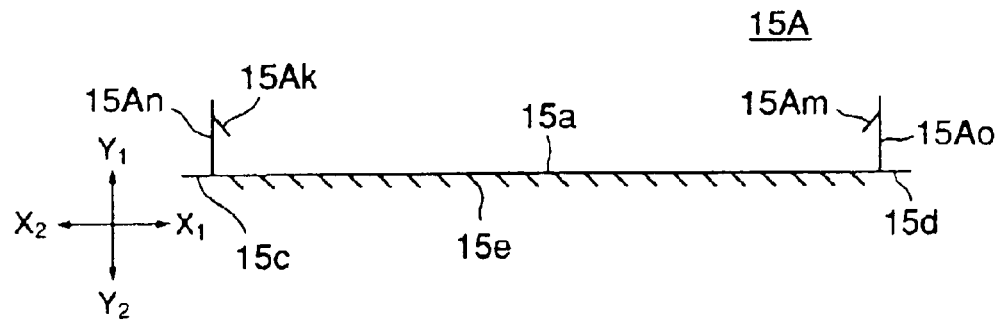
FIG. 9B is a top view of the gasket shown in FIG. 9A.

FIG. 8A is a perspective view of a balanced transmission connector device 10A according to a second embodiment of the present invention. FIG. 8B is a cross-sectional view taken along a horizontal plane VIIIB in FIG. 8A. The connector device 10A is arranged so that locking pieces of a gasket 15A are hooked in respective receding portions of metal articles 13A and 14A within the respective through holes 11c and 11d of the insulator 11.

As shown in FIG. 9A, FIG. 9B, FIG. 10 and FIG. 11, the gasket 15A includes locking pieces 15Ak and 15Am in place of the above-described locking pieces 15k and 15m. The locking piece 15Ak is formed by being partially cut and bent toward direction X1 from a Y1-end of an arm portion 15An bent from the X2-side portion 15c in direction Y1. The locking piece 15Am is formed by being partially cut and bent toward direction X2 from a Y1-end of an arm portion 15Ao bent from the X1-side portion 15d in direction Y1.

Figure 10:
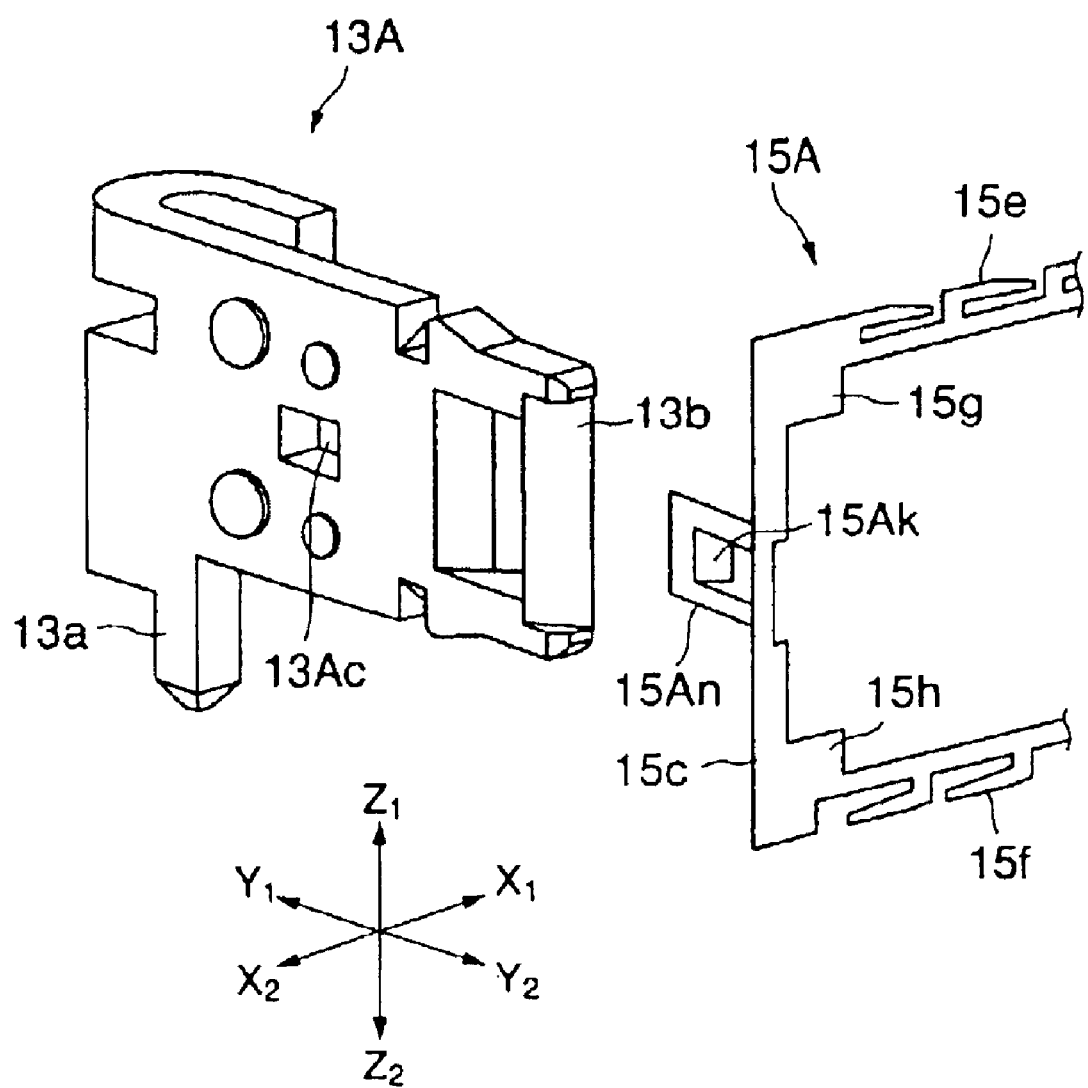
FIG. 10 is an exploded perspective view of the gasket and one metal article shown in FIG. 8A.
Figure 11:
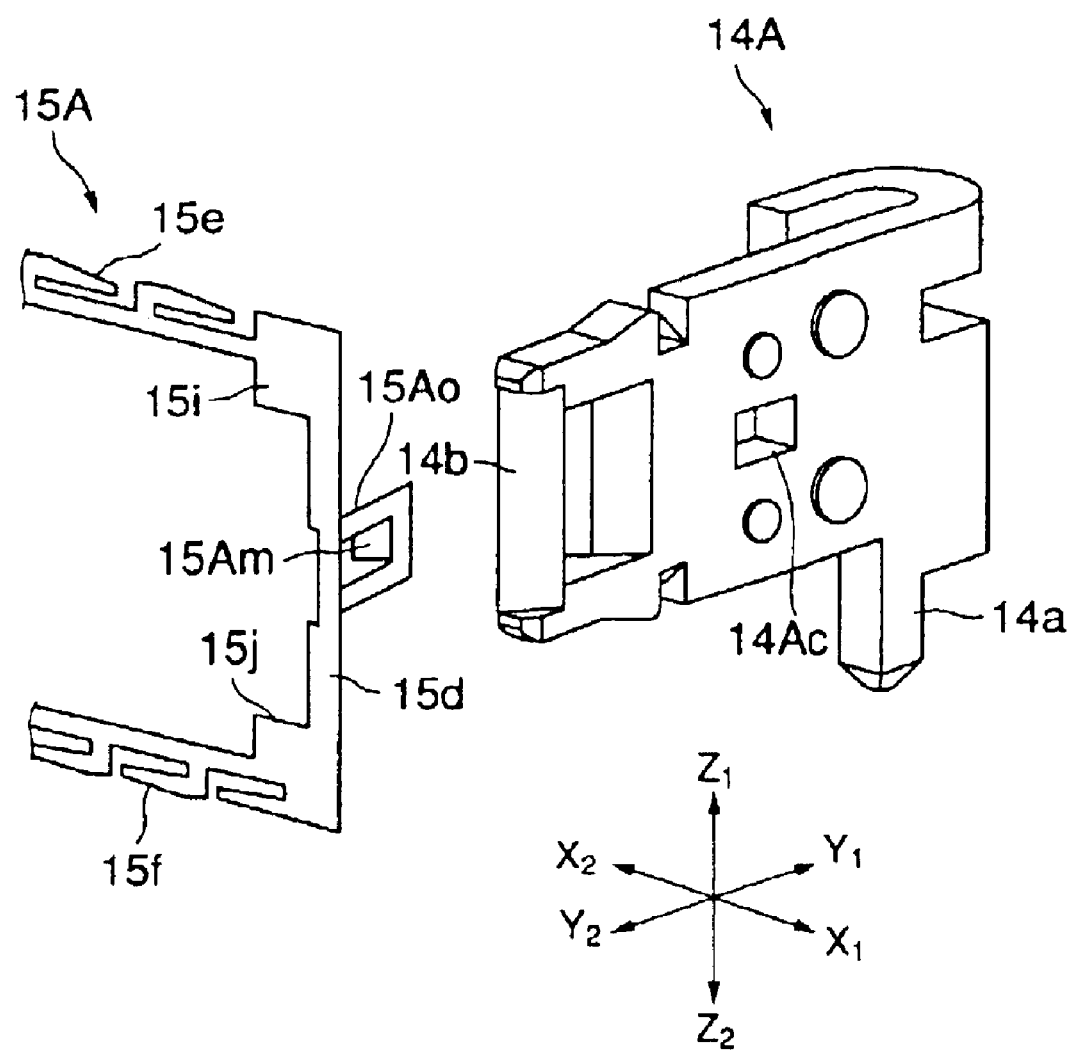
FIG. 11 is an exploded perspective view of the gasket and the other metal article shown in FIG. 8A.

As shown in FIG. 10 and FIG. 11, the metal articles 13A and 14A include receding portions 13Ac and 14Ac in place of the receding portions 13c and 14c. The receding portions 13Ac and 14Ac are formed at positions shifted in direction Y1 from positions of the receding portions 13c and 14c shown in FIG. 4 and FIG. 5. Thus, in a state where the metal articles 13A and 14A are fixed in the insulator 11, the receding portions 13Ac and 14Ac are positioned within the respective through holes 11c and 11d. The receding portions 13Ac and 14Ac may be replaced with through holes.

The gasket 15A is mounted by being set and positioned around the latch portions 13b and 14b from direction Y2 of the connector device 10A, and then being pressed against the connector device 10A. The arm portion 15An is inserted into a gap 40 between the through hole 11c and the metal article 13A, as shown in FIG. 8B. The locking piece 15Ak is bent into a same plane as the arm portion 15An so as to enter the gap 40; and, upon reaching the receding portion 13Ac, the locking piece 15Ak enters the receding portion 13Ac by resilient restoration, and hooks in the receding portion 13Ac. The arm portion 15Ao is inserted into a gap 41 between the through hole 11d and the metal article 14A, as shown in FIG. 8B. The locking piece 15Am is bent into a same plane as the arm portion 15Ao so as to enter the gap 41; and, upon reaching the receding portion 14Ac, the locking piece 15Am enters the receding portion 14Ac by resilient restoration, and hooks in the receding portion 14Ac.

Thus, the gasket 15A is mounted on the connector device 10A by the locking pieces 15Ak and 15Am hooking the receding portions 13Ac and 14Ac within the through holes 11c and 11d, respectively. Therefore, the gasket 15A does not come off even when the gasket 15A is subjected to strong impact or heat inflicted in the course of conveying the connector device 10A.

Besides, since the locking pieces 15Ak and 15Am hook the receding portions 13Ac and 14Ac within the respective through holes 11c and 11d, the locking pieces 15Ak and 15Am cannot be manipulated externally; additionally, since the arm portions 15An and 15Ao are positioned within the respective gaps 40 and 41, the arm portions 15An and 15Ao cannot be bent in direction X1-X2. Also from these respects, the gasket 15A is surely mounted on the connector device 10A.

In addition, the above-described embodiments in which the gasket 15 and the gasket 15A are mounted on the balanced transmission connector devices 10 and 10A by being hooked therein can be applicable to a common connector device.

The present invention is not limited to the specifically disclosed embodiments, and variations and modifications may be made without departing from the scope of the present invention.

The present application is based on Japanese priority application No. 2002-273153 filed on Sep. 19, 2002, the entire contents of which are hereby incorporated by reference.

What is claimed is:

1. A connector device comprising:

a gasket mounted for providing an electromagnetic shielding, the gasket comprising a locking part; and a locked part having a locked surface opposite to the locking part of the gasket in a direction approximately perpendicular to a plane of the gasket, wherein the gasket is prevented from being removed from the connector device in the direction approximately perpendicular to the plane of the gasket.

2. The connector device according to claim 1, wherein the locked part includes a through hole extending through the metal article.

3. A connector device comprising:

a gasket mounted for providing an electromagnetic shielding, the gasket having a form of a rectangular frame and including a locking part on each of shorter-side portions opposing each other as shorter sides of said rectangular frame; and a locked part included in a metal article pressed into a through hole formed in an insulator, wherein the locked part of the connector device has a locked surface opposite to the locking part of the gasket in a direction approximately perpendicular to a plane of the gasket, and wherein this gasket is prevented from being removed from the connector device in the direction approximately perpendicular to the plane of the gasket.

4. A connector device comprising:

a gasket providing electromagnetic shielding, the gasket having a form of a rectangular frame and including a locking part on each of shorter-side portions opposing each other as shorter sides of said rectangular frame; and a locked part included in a metal article pressed into a through hole formed in an insulator, wherein said locked part is positioned outside said through hole, wherein said locking part is formed so as to project from the shorter-side portion within a plane containing said gasket, and wherein said locking part hooks said locked part outside said through hole.

5. The connector device according to claim 4, wherein each locking part is positioned at a respective center of the shorter-side portions of the gasket.

6. A connector device comprising:

a gasket providing electromagnetic shielding, the gasket having a form of a rectangular frame and including a locking part on each of shorter-side portions opposing each other as shorter sides of said rectangular frame; and a locked part included in a metal article pressed into a through hole formed in an insulator, wherein said locked part is positioned within said through hole, wherein said locking part is formed on an arm portion bent from the shorter-side portion, and wherein said locking part hooks said locked part within said through hole.

7. The connector device according to claim 6, wherein the locking part enters the locked part by a spring effect of the arm portion.

8. The connector device according to claim 6, further comprising:

another locking part; and another locked part, wherein the locking parts each hook a respective one of the locked parts.

9. A gasket comprising:

first and second side portions, the first and second side portions parallel and opposite to each other; and first and second locking parts on each of the first and second side portions, wherein the gasket attaches to a connector device including a metal article extending through a through hole formed in an insulator, wherein the locked part has a locked surface opposite to at least the first locking part of the gasket in a direction approximately perpendicular to a plane of the gasket, wherein the gasket is prevented from being removed from the connector device in the direction approximately perpendicular to the plane of the gasket, wherein the locked part is positioned outside the through hole, wherein the first and second locking parts are formed so as to project from the side portions within the plane of the gasket, and wherein the first locking part hooks the locked part outside the through hole.

10. A gasket comprising:

first and second side portions, the first and second side portions parallel and opposite to each other; and first and second locking parts on each of the first and second side portions, wherein the gasket attaches to a connector device including a metal article extending through a through hole formed in an insulator, wherein the locked part has a locked surface opposite to at least the first locking part of the gasket in a direction approximately perpendicular to a plane of the gasket, wherein the gasket is prevented from being removed from the connector device in the direction approximately perpendicular to the plane of the gasket, wherein the locked part is positioned within the through hole, wherein the first locking part is formed on an arm portion bent from the first side portion, and wherein the first locking part hooks the locked part within the through hole.

11. The connector device according to claim 10, wherein the insulator prevents manipulation of the first locking part positioned in the through hole.

12. A connector comprising:

a gasket mounted providing an electromagnetic shielding, the gasket including a locking part;

a metal article including a locked part having a locked surface opposite to the locking part of the gasket in a direction approximately perpendicular to a plane of the gasket; and an insulator having a through hole in which the metal article is positioned, wherein the gasket is prevented from being removed from the connector device in the direction approximately perpendicular to the plane of the gasket.

13. A method for mounting a gasket having a tab protruding from an edge of the gasket along a plane of the gasket to an insulator having a through hole, and a metal article having a latch portion and a receding portion, comprising:

bending the tab substantially perpendicular to the plane of the gasket to form an arm portion;

bending the arm portion substantially parallel to the plane of the gasket to form a locking piece;

fixing the metal article to the insulator such that the receding portion of the metal article is within the through hole of the insulator and a gap is formed between the through hole and the metal article; and inserting the arm portion into the gap such that the locking portion enters the receding portion of the metal article.

* * * * *